(12) United States Patent
Xu et al.

(10) Patent No.: US 8,183,966 B2
(45) Date of Patent: May 22, 2012

(54) ENTIRELY INTEGRATED EMI FILTER BASED ON A FLEXIBLE MULTI-LAYER STRIP MATERIAL

(75) Inventors: Dehong Xu, Hangzhou (CN); Zhiwei Wen, Hangzhou (CN); Xiaofeng Wu, Hangzhou (CN); Yasuhiro Okuma, Tokyo (JP); Kazuaki Mino, Tokyo (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 131 days.

(21) Appl. No.: 12/749,300

(22) Filed: Mar. 29, 2010

(65) Prior Publication Data

US 2010/0245008 A1 Sep. 30, 2010

(30) Foreign Application Priority Data

Mar. 30, 2009 (CN) .......................... 2009 1 0097051

(51) Int. Cl.
*H01F 27/28* (2006.01)
(52) U.S. Cl. .......................... 336/170; 336/212; 336/223
(58) Field of Classification Search .................... 336/69, 336/212, 215, 170, 171, 172, 177, 184, 209, 336/223; 315/239, 276, 278
See application file for complete search history.

(56) References Cited

U.S. PATENT DOCUMENTS

| | | | | |
|---|---|---|---|---|
| 3,221,273 A | * | 11/1965 | Livingston | 332/170 |
| 3,633,273 A | * | 1/1972 | Wilburn et al. | 29/602.1 |
| 3,704,390 A | * | 11/1972 | Grahame | 315/276 |
| 4,327,311 A | * | 4/1982 | Wroblewski | 315/244 |
| 4,427,955 A | * | 1/1984 | Roberts | 333/177 |
| 6,014,071 A | * | 1/2000 | Onishi et al. | 336/170 |
| 6,693,505 B2 | * | 2/2004 | Bock | 336/69 |
| 6,927,650 B2 | * | 8/2005 | Okamoto | 333/181 |
| 6,980,077 B1 | * | 12/2005 | Chandrasekaran et al. | 336/212 |
| 7,136,293 B2 | * | 11/2006 | Petkov et al. | 363/126 |
| 7,671,713 B2 | * | 3/2010 | Xu et al. | 336/185 |
| 7,701,317 B2 | * | 4/2010 | Sullivan et al. | 336/178 |
| 2008/0192960 A1 | * | 8/2008 | Nussbaum et al. | 381/120 |

OTHER PUBLICATIONS

"An integrating structure of EMI filter based on interleaved flexible multi-layer (FML) foils" Xiaofeng Wu, Zhiwei Wen, Dehong Xu, Yasuhiro Okuma, Kazuaki Mino Applied Power Electronics Conference and Exposition, 2009. APEC 2009. Twenty-Fourth Annual IEEE, Feb. 15-19, 2009, pp. 491-497.

(Continued)

*Primary Examiner* — Lincoln Donovan
*Assistant Examiner* — Joselito Baisa
(74) *Attorney, Agent, or Firm* — Rabin & Berdo, P.C.

(57) ABSTRACT

An entirely integrated EMI filter is based on a flexible multi-layer strip material. An EE or EI core comprises two side pillars and one middle pillar and forms a closed magnetic circuit. The middle pillar has an air gap. A first winding and a second winding respectively are wound around the two side pillars in a same winding direction. The middle pillar is wound with a third winding and a fourth winding, or with only a fifth winding. Passive components (e.g., all passive components) of the EMI filter are integrated into one core so that in its differential mode, insertion loss is significantly reduced, the size and volume are reduced, and the distribution constant of the EMI filter has less impact on the filter's performance.

6 Claims, 5 Drawing Sheets

AIR GAP

OTHER PUBLICATIONS

Yanjun Zhang et al., "Utilizing Flexible Printed Circuit Board (FPCB) to realize passives integration in LLC resonant converter", Applied Power Electronics Conference and Exposition, 2008, APEC 2008., pp. 1465-1471.

Cheng Deng et al., "Impact of dielectric material on passive integration in LLC resonant converter", Proc. of IEEE PESC'2008, Jun. 2008, Rhodes Island, Greece, pp. 269-272.

Xiaofeng Wu et al., "Integrated EMI Filter design with flexible PCB Structure" Proc. of IEEE PSEC'2008, Jun. 2008, Rhodes Island, Greece, pp. 1613-1617.

Xiaofeng Wu et al., "Modeling of integrated EMI filter with flexible multi-layer (FML) foils", IPEMC2009, Feb. 2009, Wuhan, China, pp. 749-755.

Xiaofeng Wu et al., "Modeling of integrated EMI filter with flexible multi-layer (FML) foils", Energy Conversion Congress and Exposition, 2009, ECCE 2009, pp. 3415-3422.

Yasuhiro Okuma et al., Analysis of the Inductor Equivalent Parallel Capacitor (EPC) of Integrated EMI (Electromagnetic Interference) Filters and the Improvements of the Common-mode Insertion Loss.

* cited by examiner

ENTIRELY INTEGRATED EMI FILTER BASED ON A FLEXIBLE MULTI-LAYER STRIP MATERIAL

CROSS-REFERENCE TO RELATED APPLICATIONS

This application claims priority under 35 U.S.C. §119 from Chinese Patent Application No. 200910097051.X, filed Mar. 30, 2009, the entirety of which is incorporated herein by reference.

BACKGROUND

1. Field of the Invention

Embodiments of the present invention relate to an electronic device, and in particular to an entirely integrated EMI filter based on a flexible multi-layer strip material.

2. Related Art

Modularization, miniaturization and high density of power are a trend in electric and electronic devices. On one hand, it is desired to reduce the size of each component in an electric and electronic device. And on the other hand, a higher and higher performance is required from EMI filters due to serious electromagnetic interference (EMI). Traditional EMI filters have disadvantages including too many discrete components and inefficient usage of space. In addition, the performance of traditional EMI filters is easily affected by a distribution constant.

SUMMARY OF THE INVENTION

Embodiments of the present invention provide an entirely integrated EMI filter based on a flexible multi-layer strip material to overcome the above-described disadvantages of traditional EMI filters.

According to the embodiments, in an entirely integrated EMI filter based on a flexible multi-layer strip material, an EE or EI core can form a closed magnetic circuit comprising two side pillars and one middle pillar. The middle pillar can have an air gap.

A first winding and a second winding can be respectively wound around the two side pillars in a same winding direction. The middle pillar can be wound with two windings of third and fourth windings, or with only one winding of a fifth winding. If the middle pillar has been wound with the two windings of the third winding and the fourth winding, the third winding can be wound in an opposite winding direction to a winding direction of the fourth winding. Two terminals at final ends of the first winding can be respectively connected with two terminals at starting ends of the second winding, and two terminals at final ends of the second winding can be respectively connected with a terminal at each of starting ends of the third winding and the fourth winding.

If the middle pillar has been wound with one winding of the fifth winding, the two terminals at the final end of the first winding can be respectively connected with the two terminals at the starting ends of the second winding, and the two terminals at the final ends of the second winding can be respectively connected with two terminals at a starting end of the fifth winding. Alternatively, the two terminals at the final ends of the second winding can be respectively connected with a terminal on the starting end of the fifth winding, and a terminal on a final end of the fifth winding, wherein the terminal on the starting end of the fifth winding, and the terminal on the final end of the fifth winding are spaced apart from each other in a diagonal direction.

Further, both of the first winding and the second winding can be formed by winding a flexible multi-layer strip material in a staggered, e.g., alternating, and parallel pattern including 2N or more copper foils, wherein N is a positive integer. Starting ends of the copper foils of odd-numbered layers can be connected, e.g., short-connected. Final ends of the copper foils of odd-numbered layers can be connected, e.g., short-connected, and starting ends of the copper foils of even-numbered layers can be connected, e.g., short-connected. Moreover, final ends of the copper foils of even-numbered layers can be connected, e.g., short-connected, thus forming four connection terminals.

Both of the third winding and the fourth winding can be formed by winding a flexible multi-layer strip material in a staggered and parallel pattern including 2M or more of copper foils, wherein M is a positive integer. Starting ends of the copper foils of even-numbered layers can be connected, e.g., short-connected, and final ends of the copper foils of even-numbered layers can be connected, e.g., short-connected, thus forming two external connection terminals. Ends of the copper foils of odd-numbered layers can be connected, e.g., short-connected, and grounded, but other ends thereof may not be processed in any particular way.

The fifth winding can be formed by winding a flexible multi-layer strip material in a staggered and parallel pattern including 3K or more of copper foils, wherein K is a positive and n is zero or a positive integer, n≦K. Starting ends of the copper foils of 3 nth layers can be connected, e.g., short-connected, and final ends of the copper foils of the 3 nth layers can be connected, e.g., short-connected. Moreover, starting ends of the copper foils of (3n+1)th layers can be connected, e.g., short-connected, and final ends of the copper foils of (3n+1)th layers can be connected, e.g., short-connected, thus forming four external connection terminals. Ends of the copper foils of (3n+2)th layers can be connected, e.g., short-connected, and grounded, but other ends thereof may not be processed in any particular way.

Expressed in other terms, embodiments of the invention relate to an EMI filter that can comprise an EE core or EI core including two side pillars and one middle pillar, and forming a closed magnetic circuit, the middle pillar having an air gap. The EMI filter can further comprise a first winding and a second winding respectively wound around the two side pillars in a same winding direction, wherein the middle pillar has one of a third winding and a fourth winding, or a fifth winding. The first through fifth windings can include a flexible multi-layer strip material.

In the EMI filter according to the embodiments, if the middle pillar has the third winding and the fourth winding, the third winding can be wound in an opposite winding direction to a winding direction of the fourth winding. Two terminals at a final end of the first winding can be respectively connected with two terminals at a starting end of the second winding. Moreover, two terminals at a final end of the second winding can be respectively connected with a terminal at a starting end of the third winding and a terminal at a starting end of the fourth winding.

Additionally, in the EMI filter according to the embodiments, if the middle pillar has the fifth winding, two terminals at a final end of the first winding can be respectively connected with two terminals at a starting end of the second winding, and two terminals at a final end of the second winding can be respectively connected with two terminals at a starting end of the fifth winding.

Further, the flexible multi-layer strip material of the first winding and the second winding can be arranged in a staggered, e.g., alternating, and parallel pattern including at least 2N of copper foil layers, wherein N is a positive integer. Starting ends of odd-numbered copper foil layers in a sequence of the copper foil layers can be connected, and final ends of the odd-numbered copper foil layers can be connected. Starting ends of even-numbered copper foil layers in the sequence of copper foil layers can be connected, and final ends of copper foils of the even-numbered copper foil layers can be connected, to form four connection terminals.

Moreover, in the EMI filter according to the embodiments, the flexible multi-layer strip material of the third winding and the fourth winding can be arranged in a staggered and parallel pattern including at least 2M of copper foil layers, wherein M is a positive integer. In the third winding, starting ends of even-numbered copper foil layers in a sequence of the copper foil layers can be connected and final ends of the even-numbered copper foil layers can be connected, to form an external connection terminal. In the fourth winding, starting ends of odd-numbered copper foil layers in the sequence of the copper foil layers can be connected and final ends of the odd-numbered copper foil layers can be connected, to form another external connection terminal. Ends of odd-numbered copper foil layers in the third winding, and even-numbered copper foil layers in the fourth winding, can be connected and grounded.

Still further, in the EMI filter according to the embodiments, the flexible multi-layer strip material of the fifth winding can be arranged in a staggered and parallel pattern including at least 3K of copper foil layers, wherein K is a positive integer. Starting ends of $(3n+1)$th copper foil layers in a sequence the copper foil layers, wherein n is zero or a positive integer, $n \leq K$, can be connected, and final ends of the $(3n+1)$th copper foil layers can be connected. Starting ends of $(3n+3)$th copper foil layers in the sequence the copper foil layers can be connected, and final ends of the $(3n+3)$th copper foil layers can be connected, to form four external connection terminals. Ends of $(3n+2)$th copper foil layers in the sequence the copper foil layers can be connected and grounded.

Advantages of embodiments of the present invention include enabling all passive components of the EMI filter to be integrated in one core, so that in its differential mode, insertion loss can be significantly reduced, so as to reduce the impact of the volume and the distribution constant of the EMI filter on the performance of the filter. Additionally, the size and volume of the EMI filter can be reduced.

BRIEF DESCRIPTION OF THE DRAWINGS

FIGS. 2A, 2B and 2C schematically show the configuration and the connection of the flexible multi-layer strip material in four windings as shown in FIG. 1, wherein FIG. 2A shows the first winding, FIG. 2B shows the second winding and FIG. 2C shows the third and the fourth windings;

FIGS. 3A and 3B schematically show a distribution model structure and an integrated model structure of the first embodiment, wherein FIG. 3A shows the distribution model, and FIG. 3B shows the integrated model;

FIGS. 6A and 6B schematically show a distribution model structure and an integrated model structure of the second embodiment, wherein FIG. 6A shows the distribution model, and FIG. 6B shows the integrated model.

DETAILED DESCRIPTION OF THE INVENTION

Figure 1:
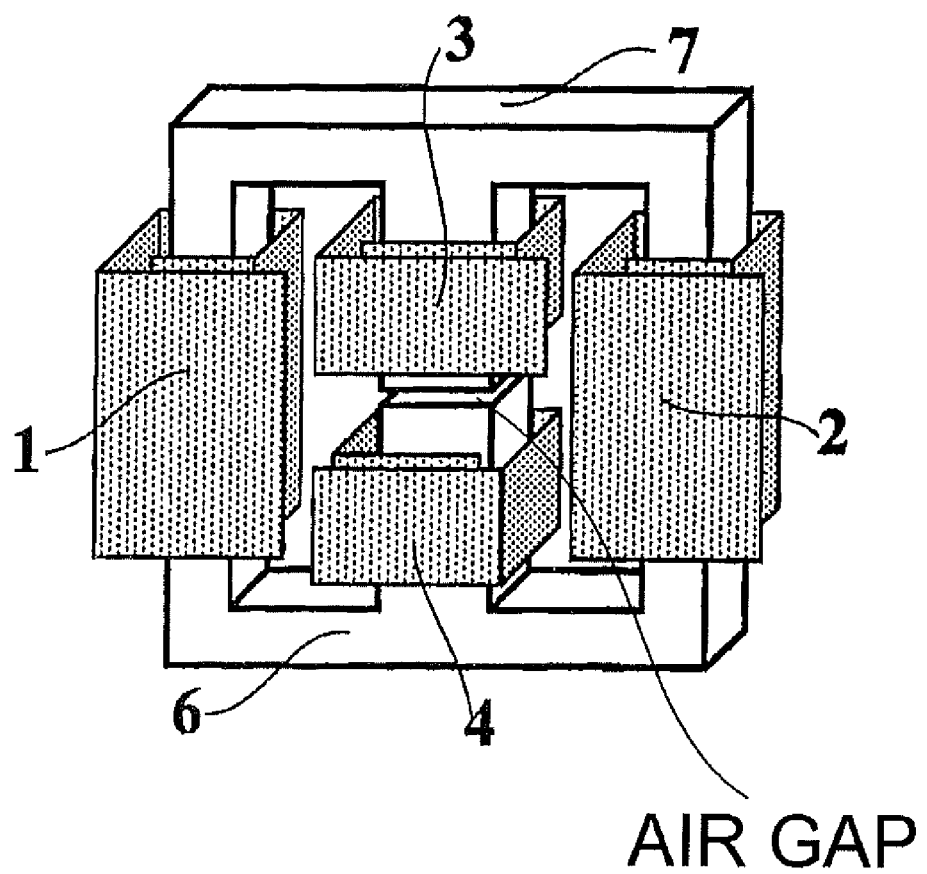
FIG. 1 schematically shows the structure of a first embodiment of the present invention.

The embodiments of the invention will now be described in more detail by way of example, with reference to the embodiments shown in the accompanying Figures. It should be kept in mind that the following described embodiments are only presented by way of example and should not be construed as limiting the inventive concept to any particular physical configuration.

In an entirely integrated EMI filter based on a flexible multi-layer strip material according to embodiments of the present invention, an EE or EI core forms a closed magnetic circuit which comprises two side pillars and one middle pillar. The middle pillar has an air gap. The windings formed by winding the flexible multi-layer strip material are respectively placed on the two side pillars and the middle pillar of the core. The windings on the two side pillars are of the same structure, have the same winding direction and can be made of a flexible multi-layer strip material in a staggered, e.g., alternating, and parallel pattern including 2N or more of the copper foils. The flexible multi-layer strip material is formed, for example, by laminating and bonding layers in the following order: a copper foil, thin film material, copper foil, thin film material . . . thin film material, copper foil, and insulating material such as insulation tape. The strip material has, e.g., 2N or more of copper foils, in which N is a positive integer, and starting ends of the copper foils of odd-numbered layers are connected, e.g., short-connected. Final ends of the copper foils of odd numbered layers are connected, e.g., short-connected, and starting ends of the copper foils of even-numbered layers are connected, e.g., short-connected. Final ends of the copper foils of even-numbered layers are connected, e.g., short-connected, thus forming four connection terminals for each winding. The middle pillar has two windings or just one winding.

If the middle pillar has two windings, the two windings are of the same structure and respectively wind in directions opposite to each other. The two windings can be made of a flexible multi-layer strip material in a staggered and parallel pattern including, e.g., 2M or more of the copper foils. The flexible multi-layer strip material is formed, for example, by laminating and bonding layer in the following order: a copper foil, thin film material, copper foil, thin film material . . . thin film material, copper foil, insulation tape. The strip material has, e.g., 2M or more of copper foils, in which M is a positive integer. Starting ends of the copper foils of even-numbered layers in each winding are connected, e.g., short-connected. Final ends of the copper foils of even-numbered layers in each winding are connected, e.g., short-connected, thus forming two external connection terminals. Ends of the copper foils of odd-numbered layers are connected, e.g., short-connected, and grounded, but other ends thereof may not be processed in any particular way. Two terminals at the starting end of one of the windings on the side pillars are connected to an external circuit, and two terminals at the final end of the one of the windings are connected to the two terminals at the starting end of another winding on the side pillars. The two terminals at the final end of the one of the windings are respectively connected to a terminal at each of the starting ends of the two windings on the middle pillar, and a terminal at each of the final ends of the two windings on the middle pillar is connected to an external circuit.

If the middle pillar has only one winding, the winding is made of a flexible multi-layer strip material in a staggered and parallel pattern including, e.g., 3K or more of the copper foils. The flexible multi-layer strip material is formed, for example, by laminating and bonding layers in the following order: a copper foil, thin film material, copper foil, thin film material . . . thin film material, copper foil, insulation tape. The strip material has, e.g., 3K or more of copper foils, in which K is a positive integer, n is zero or a positive integer, $n \leq K$, and starting ends of the copper foils of 3 nth layers are connected, e.g., short-connected. Final ends of the copper foils of 3 nth layers are connected, e.g., short-connected, and starting ends of the copper foils of (3n+1)th layers are connected, e.g., short-connected. Final ends of the copper foils of (3n+1)th layers are connected, e.g., short-connected, thus forming four external connection terminals. Ends of the copper foils of (3n+2)th layers are connected, e.g., short-connected and grounded, but other ends thereof may not be processed in any particular way.

Two terminals at the starting end of one of the windings on the side pillars are connected to an external circuit, and two terminals at the final end of the one of the windings are connected to the two terminals at the starting end of another winding on the side pillars. The two terminals at the final end of the one of the windings are respectively connected to the two diagonal terminals on the middle pillar, and two other terminals on the middle pillar are connected to the external circuit.

The differential mode capacitors and the common mode inductors according to embodiments of the present invention are integrated in the windings of the side pillars. The neighboring copper foils in the windings collectively form the differential mode capacitors in the EMI filter by forming electric field coupling through the layer of insulation media placed therein. In a common mode circuit, the magnetic flux generated in the middle winding can be neglected and thus no magnetic flux will pass through the middle pillar. On the other hand, the magnetic fluxes generated in the windings on the side pillars enhance each other and couple with each other, thus forming very strong common mode inductance due to the low magnetic resistance in the magnetic circuit.

The common mode capacitors and the differential mode inductors according to embodiments of the present invention are integrated in the windings of the middle pillars. The neighboring copper foils in the same turn of the winding collectively form the common mode capacitors in the EMI filter by forming electric field coupling through the layer of insulation media placed therein. In a differential mode circuit, the magnetic flux generated in the windings on the side pillars can be neglected. On the other hand, the magnetic fluxes generated in the windings on the middle pillar enhance each other, thus forming very strong differential mode inductance due to the low resistance in the circuit. The differential mode inductance value can be adjusted within a very wide range through adjusting the length of the air gap in the middle pillar and the number of the turns of the windings.

In view of the foregoing description, passive components (e.g., all of the passive components) in the EMI filter according to embodiments of the present invention are advantageously integrated in the same core, resulting in a compact structure with high efficiency of space utilization and a reduction in the size of the EMI filter.

Embodiment 1

Referring to FIG. 1, an EMI filter based on a flexible multi-layer strip material according to an embodiment of the invention is shown. An EE core or EI core (6, 7) forms a closed magnetic circuit. The middle pillar has an air gap. The two windings on the side pillars are formed by winding layers, for example, four layers, of strip material, and are wound in the same winding direction with the number of turns in each winding being identical. Similarly, the two windings on the middle pillar are formed by winding layers, for example, four layers, of strip material, and are respectively wound in directions opposite to each other, with the numbers of the turns in the windings being the same.

Figure 2A:
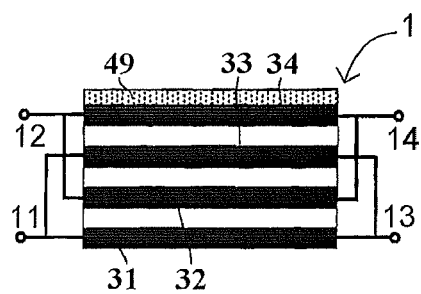
Figure 2B:
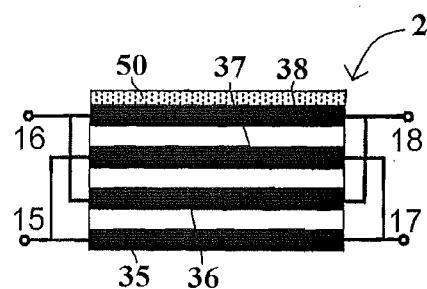

The two windings (the first winding 1 and the second winding 2) on the side pillars are formed by winding 2N or more layers (N is a positive integer; in this embodiment, four (N=2) layers of copper foils as illustrated in FIGS. 2A and 2B) of flexible multi-layer strip material and are wound in the same winding direction, with the numbers of the turns in the windings being identical.

Figure 2C:
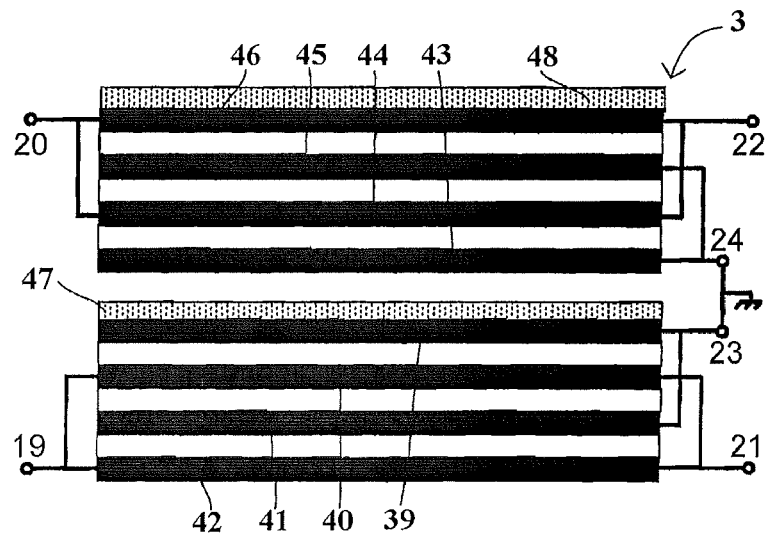

On the other hand, the two windings (the third winding 3 and the four winding 4) on the middle pillar are formed by winding 2M or more layers (M is a positive integer; in this embodiment, four (M=2) layers of copper foils as illustrated in FIG. 2C) of flexible multi-layer strip material and are wound in directions opposite to each other, with the number of turns in the windings being identical.

As mentioned above, the flexible multi-layer strip material is formed by laminating and bonding copper foil, thin film material, copper foil, thin film material . . . thin film material, copper foil, insulation tape in this order.

For example, the first winding 1 of the flexible multi-layer strip material as shown in FIG. 2A is formed by laminating copper foil 31, thin film material, copper foil 32, thin film material, copper foil 33, thin film material, copper foil 34, insulation tape 49 in this order.

Similarly, the second winding 2 of the flexible multi-layer strip material as shown in FIG. 2B is formed by laminating copper foil 35, thin film material, copper foil 36, thin film material, copper foil 37, thin film material, copper foil 38, insulation tape 50 in this order.

The third winding 3 of the flexible multi-layer strip material as shown in FIG. 2C is formed by laminating copper foil 43, thin film material, copper foil 44, thin film material, copper foil 45, thin film material, copper foil 46, insulation tape 48 in this order. The fourth winding 4 of the flexible multi-layer strip material as shown in FIG. 2C is formed by laminating copper foil 42, thin film material, copper foil 41, thin film material, copper foil 40, thin film material, copper foil 39, insulation tape 47 in this order.

In FIGS. 2A-2C, although no reference numeral is attached to each thin film material, the portions (indicated in white or a lighter color than the copper foil layers) pinched or layered between the respective copper foils represent the thin film materials.

In the above description, the left ends of the copper foils as shown in FIGS. 2A to 2C are defined as the starting ends and the right ends are defined as the final ends.

Referring to FIGS. 1 and 2, in first winding 1, the starting ends of copper foils 31 and 33 are connected, e.g., short-connected, to form terminal 11, and their final ends are connected, e.g., short-connected, to form terminal 13. The starting ends of copper foils 32 and 34 are connected, e.g., short-connected, to form terminal 12, and their final ends are connected, e.g., short-connected, to form terminal 14.

In second winding 2, the starting ends of copper foils 35 and 37 are connected, e.g., short-connected, to form terminal 15, and their final ends are connected, e.g., short-connected, to form terminal 17. The starting ends of copper foils 36 and 38 are connected, e.g., short-connected, to form terminal 16 and their final ends are short connected to form terminal 18.

In third winding 3, the starting ends of copper foils 44 and 46 are connected, e.g., short-connected, to form terminal 20, and their final ends are connected, e.g., short-connected, to form terminal 22. The final ends of copper foils 43 and 45 are connected, e.g., short-connected, to form terminal 24.

Figure 3A:
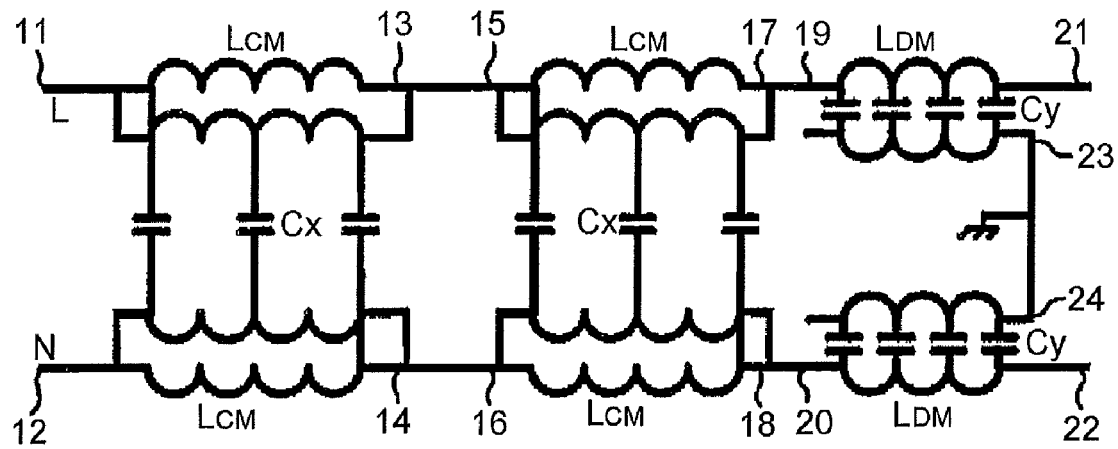
Figure 3B:
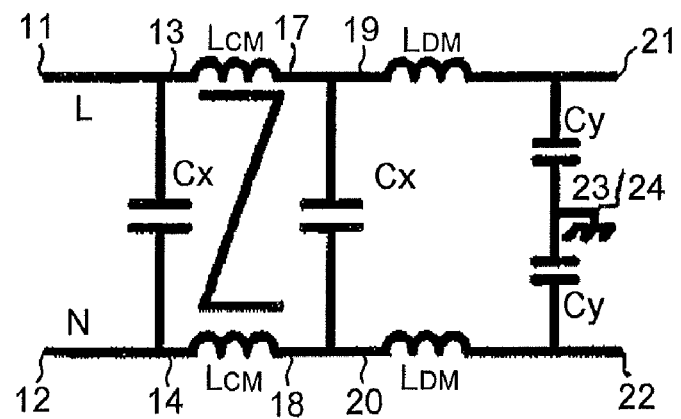

In fourth winding 4, the starting ends of copper foils 40 and 42 are connected, e.g., short-connected, to form terminal 19, and their final ends are connected, e.g., short-connected, to form terminal 21. The final ends of copper foils 39 and 41 are connected, e.g., short-connected, to form terminal 23. Terminal 13 is connected to terminal 15, and terminal 14 is connected to terminal 16. Terminal 17 is connected to terminal 19 and terminal 18 is connected to terminal 20. The other two terminals 23 and 24 on the middle pillar are connected to earth, e.g., grounded. Terminals 11 and 12 are configured to be connected to power supply lines L and N (see FIG. 3), and terminals 21 and 22 are configured to be connected to electric and electronic devices. FIGS. 3A and 3B show the distribution mode and the integrated mode of the entirely integrated structure 1 when connection has been done. The above FIGS. 3A and 3B show the respective numbers of the terminals in order to illustrate the connection state of the above terminals clearly.

As apparent from FIGS. 3A and 3B, the first winding 1 and the second winding 2 which are wound on the side pillars form the differential mode capacitors $C_x$ and the common mode inductors $L_{CM}$. The third winding 3 and the fourth winding 4 which are wound on the middle pillar form the common mode capacitor $C_y$ and the differential mode inductor $L_{DM}$.

As mentioned above, in the EMI filter according to the first embodiment, passive components (e.g., all passive components) of the EMI filter are integrated in one core, thereby realizing a compact structure, improving the space usage, and reducing the size of the EMI filter effectively.

Embodiment 2

Figure 4:
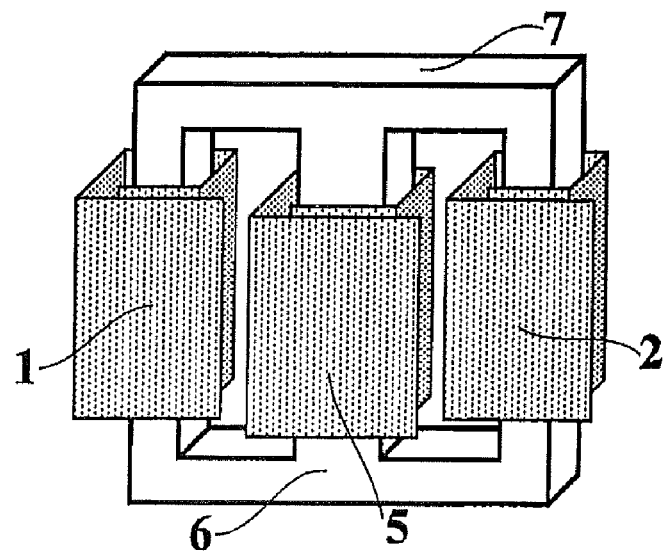
FIG. 4 schematically shows the structure of a second embodiment of the present invention.

Referring to FIG. 4, an EMI filter based on a flexible multi-layer strip material is shown. An EE core or EI core (6, 7) forms a closed magnetic circuit. The middle pillar has an air gap. The two windings on the side pillars are formed by winding layers, for example, four layers, of strip material, and are wound in the same winding direction, with the numbers of the turns in the windings being identical. Similarly, the windings on the middle pillar are formed by winding layers, for example, six layers, of strip material.

Figure 5:
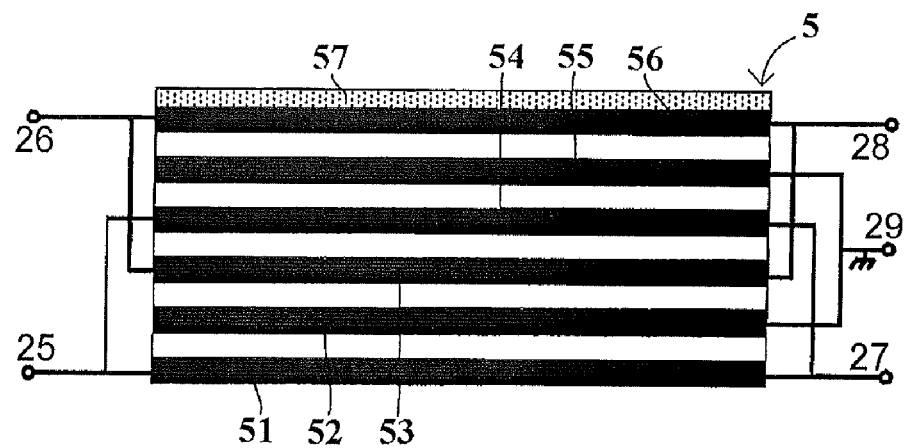
FIG. 5 schematically shows the configuration and the connection of the flexible multi-layer strip material in the fifth winding as shown in FIG. 4.

In more detail, a fifth winding 5 on the middle pillar is formed by winding 3K or more copper foil layers (K is a positive integer) of flexible multi-layer strip material around the middle pillar, and in this embodiment, six layers (K=2) of flexible multi-layer strip material are wound, as illustrated in FIG. 5. The fifth winding 5 is wound in the same winding direction as the first winding 1 and the second winding 2.

Referring to FIGS. 2A and 2B, 4 and 5, in first winding 1, the starting ends of copper foils 31 and 33 are connected, e.g., short-connected, to form terminal 11, and their final ends are connected, e.g., short-connected, to form terminal 13. The starting ends of copper foils 32 and 34 are connected, e.g., short-connected, to form terminal 12, and their final ends are connected, e.g., short-connected, to form terminal 14. In second winding 2, the starting ends of copper foils 35 and 37 are connected, e.g., short-connected, to form terminal 15, and their final ends are connected, e.g., short-connected, to form terminal 17. The starting ends of the copper foils 36 and 38 are connected, e.g., short-connected, to form terminal 16 and the final ends thereof are connected, e.g., short-connected, to form terminal 18. The fifth winding 5 of flexible multi-layer strip material (as mentioned above, six layers in this embodiment) is formed by laminating copper foil 51, thin film material, copper foil 52, thin film material, copper foil 53, thin film material, copper foil 54, thin film material, copper foil 55, thin film material, copper foil 56, and insulation tape 57 in this order, as shown in FIG. 5.

In fifth winding 5, the starting ends of copper foils 53 and 56 are connected, e.g., short-connected, to form terminal 26 and their final ends are connected, e.g., short-connected, to form terminal 28. The starting ends of copper foils 51 and 54 are connected, e.g., short-connected, to form terminal 25, and their final ends are connected, e.g., short-connected, to form terminal 27. The final ends of copper foils 52 and 55 are connected, e.g., short-connected, to form terminal 29.

Figure 6A:
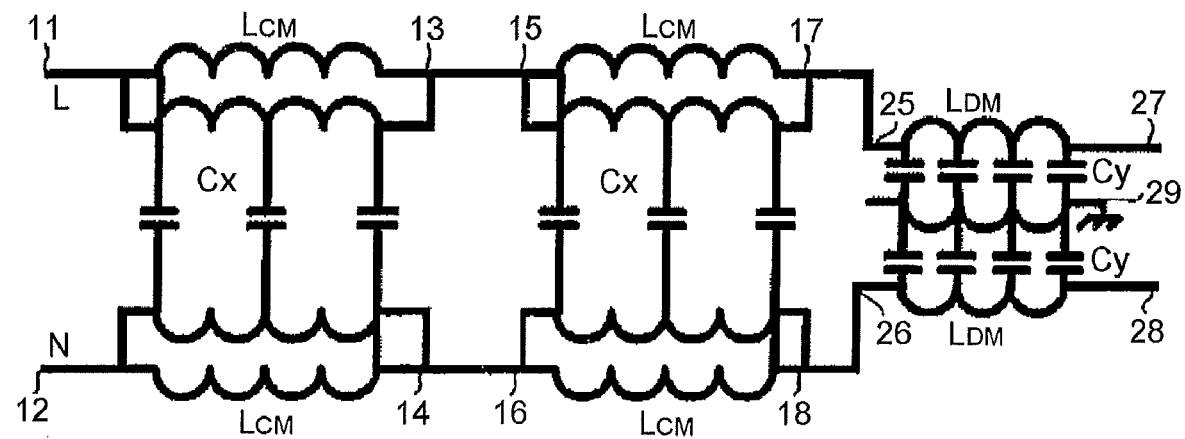
Figure 6B:
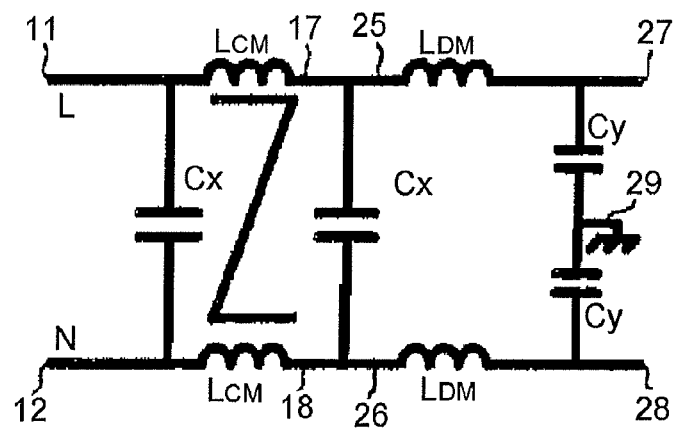

Terminal 13 is connected to terminal 15 and terminal 14 is connected to terminal 16; terminal 17 is connected to terminal 25 and terminal 18 is connected to terminal 26. Terminal 29 is connected to earth, e.g., grounded. Terminals 11 and 12 are configured to be connected to power supply lines L and N and terminals 27 and 28 are configured to be connected to electric and electronic devices. FIGS. 6A and 6B show the distribution mode and the integrated mode of the entirely integrated structure 2 when connection has been done.

As illustrated in FIG. 6B, the integrated model is substantially the same as that shown in FIG. 3B of the first embodiment, and therefore it is not described here.

As mentioned above, in the EMI filter according to the second embodiment, passive components (e.g., all passive components) of the EMI filter are integrated in one core, thereby realizing a compact structure, improving the space usage, and reducing the size of the EMI filter effectively.

Further, although conventional structures form a differential mode inductor with leakage inductance, embodiments of the present invention form a differential mode inductor with the magnetic flux generated when a current passes through the winding 3, the winding 4, or the winding 5. Therefore, it can obtain a larger inductance and greatly reduce the insertion loss in the differential mode.

Further, capacitors are formed between not only the adjacent copper foils but also all the copper foils in the winding 1 and the winding 2, thereby forming a distributed constant circuit. In embodiments according to the present invention, however, a large differential mode inductance can be obtained in the winding 3, the winding 4, or the winding 5, and noises passing through the distributed constant (capacitance) generated between each copper foil in the winding 1 and the winding 2 can be restrained effectively, thereby realizing an EMI filter with low noise performance.

In an alternative embodiment, the two terminals 17, 18 at the final end of the second winding 2 are respectively connected with the two terminals 25, 28 of the fifth winding. Referring to the view shown in FIG. 5, it can be seen that the terminal 25 on the starting end of the fifth winding, and the terminal 28 on the final end of the fifth winding are spaced apart from each other in a diagonal direction.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. An EMI filter, comprising:
   an EE core or EI core including two side pillars and one middle pillar and forming a closed magnetic circuit, the middle pillar having an air gap; and
   a first winding and a second winding respectively wound around the two side pillars in a same winding direction; wherein
   the middle pillar has one of
      a third winding and a fourth winding, or
      a fifth winding, and
      the first through fifth windings include a flexible multi-layer strip material.

2. The EMI filter according to claim 1, wherein if the middle pillar has the third winding and the fourth winding:
   the third winding is wound in an opposite winding direction to a winding direction of the fourth winding;
   two terminals at a final end of the first winding are respectively connected with two terminals at a starting end of the second winding; and
   two terminals at a final end of the second winding are respectively connected with a terminal at a starting end of the third winding and a terminal at a starting end of the fourth winding.

3. The EMI filter according to claim 1, wherein if the middle pillar has the fifth winding:
   two terminals at a final end of the first winding are respectively connected with two terminals at a starting end of the second winding; and
   two terminals at a final end of the second winding are respectively connected with two terminals at a starting end of the fifth winding.

4. The EMI filter according to claim 1, wherein:
   the flexible multi-layer strip material of the first winding and the second winding is arranged in a staggered and parallel pattern including at least 2N of copper foil layers, wherein N is a positive integer;
   starting ends of odd-numbered copper foil layers in a sequence of the copper foil layers are connected and final ends of the odd-numbered copper foil layers are connected; and
   starting ends of even-numbered copper foil layers in the sequence of copper foil layers are connected and final ends of copper foils of the even-numbered copper foil layers are connected, to form four connection terminals.

5. The EMI filter according to claim 1, wherein:
   the flexible multi-layer strip material of the third winding and the fourth winding is arranged in a staggered and parallel pattern including at least 2M of copper foil layers, wherein M is a positive integer;
   in the third winding, starting ends of even-numbered copper foil layers in a sequence of the copper foil layers are connected and final ends of the even-numbered copper foil layers are connected, to form an external connection terminal;
   in the fourth winding, starting ends of odd-numbered copper foil layers in the sequence of the copper foil layers are connected and final ends of the odd-numbered copper foil layers are connected, to form another external connection terminal; and
   ends of odd-numbered copper foil layers in the third winding, and even-numbered copper foil layers in the fourth winding, are connected and grounded.

6. The EMI filter according to claim 1, wherein:
   the flexible multi-layer strip material of the fifth winding is arranged in a staggered and parallel pattern including at least 3K of copper foil layers, wherein K is a positive integer;
   starting ends of $(3n+1)$th copper foil layers in a sequence the copper foil layers, wherein n is zero or a positive integer, $n \leq K$, are connected and final ends of the $(3n+1)$th copper foil layers are connected;
   starting ends of $(3n+3)$th copper foil layers in the sequence the copper foil layers are connected and final ends of the $(3n+3)$th copper foil layers are connected, to form four external connection terminals; and
   ends of $(3n+2)$th copper foil layers in the sequence the copper foil layers are connected and grounded.

* * * * *

UNITED STATES PATENT AND TRADEMARK OFFICE
CERTIFICATE OF CORRECTION

PATENT NO. : 8,183,966 B2
APPLICATION NO. : 12/749300
DATED : May 22, 2012
INVENTOR(S) : Dehong Xu et al.

Page 1 of 1

It is certified that error appears in the above-identified patent and that said Letters Patent is hereby corrected as shown below:

Title Page, Item 73 (Assignee)

Please change the listing of Assignees to read as follows:

-- Zhe Jiang University, Zhejiang Province (CN)
Fuji Electric Co., Ltd., Kawasaki-Shi (JP) --

Signed and Sealed this
Tenth Day of July, 2012

David J. Kappos
*Director of the United States Patent and Trademark Office*